United States Patent [19]

Alexis

[11] Patent Number: 5,621,686
[45] Date of Patent: Apr. 15, 1997

[54] MULTIPLY AND DIVIDE CURRENT MIRROR

[75] Inventor: Ranjeet Alexis, Folsom, Calif.

[73] Assignee: Intel Corporation, Santa Clara, Calif.

[21] Appl. No.: 480,797

[22] Filed: Jun. 7, 1995

[51] Int. Cl.$^6$ .................................................. G11C 7/02
[52] U.S. Cl. ........................ 365/185.21; 365/208; 327/53
[58] Field of Search ........................... 365/185.2, 185.21, 365/207, 208; 327/51, 52, 53

[56] References Cited

U.S. PATENT DOCUMENTS 4,649,301  3/1987  Van Tran ................................... 327/53
5,218,570  6/1993  Pascucci ................................... 327/52
5,289,412  2/1994  Frary ................................... 365/185.21

*Primary Examiner*—David C. Nelms
*Assistant Examiner*—Son Mai
*Attorney, Agent, or Firm*—Blakely, Sokoloff, Taylor & Zafman

[57] ABSTRACT

A current mirroring circuit including first and second field effect transistor devices connected in a current mirroring arrangement, a circuit for summing a first plurality of identical currents to provide current for the first field effect transistor device, a circuit for dividing the current from the second field effect transistor device into a second plurality of identical currents, and an output circuit connected to mirror any one of the second plurality of identical currents.

20 Claims, 2 Drawing Sheets

MULTIPLY AND DIVIDE CURRENT MIRROR

BACKGROUND OF THE INVENTION

1. Field of the Invention

This invention relates to circuitry for controlling the value of currents and, more particularly, to methods and apparatus for providing improved current mirroring circuitry.

2. History of the Prior Art

In electronic circuitry, it is often desirable to provide a current which has a value identical to that of current through some other circuit device not in series with the first device. This is typically accomplished through the use of a current mirroring circuit. By maintaining the voltage levels equal at the gate and source terminals of a pair of field effect transistor devices operating in saturation, the current through the devices may be kept equal. There are situations in which the voltage values at various nodes of the current mirroring circuitry must be changed before proper operation of the circuitry can occur. For example, when power is first applied to a circuit including current mirrors, voltages at some circuit nodes exhibiting capacitive loading must be brought to certain values in order for the circuit to function correctly. Often these circuits use only a small amount of current for operational purposes and the current mirroring properties of the circuits are designed to provide these precise small amounts. If only a small amount of current is available, an inordinate amount of time would typically be required for any substantial inherently capacitive load at the node to be charged to change the voltage level.

It is desirable to be able to provide a current mirror circuit which is capable of rapidly changing the voltages at nodes of the circuit exhibiting capacitive loading while mirroring amounts of current smaller than are capable of charging the inherent capacitances at the varying nodes of the current mirror circuit within the time period allowed for the change.

SUMMARY OF THE INVENTION

It is, therefore, an object of the present invention to provide apparatus and a method for providing current mirroring circuits capable of changing voltages at circuit nodes very rapidly while maintaining precise small current levels.

These and other objects of the present invention are realized using apparatus which includes a central current mirroring portion which receives input current from a first portion in which a small current is mirrored a number of times to multiply its value to provide a total current to charge a capacitive load rapidly. The total mirrored current from the central portion is divided to ground through a second portion including a number of parallel mirroring transistors devices. Then the value of the divided current is again mirrored to provide a current value to be used in the operation of some device. Using this circuitry, the voltage at a circuit node may be charged rapidly on power up, while only a small precise amount of current is utilized in the operating circuitry once power up has been attained. These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
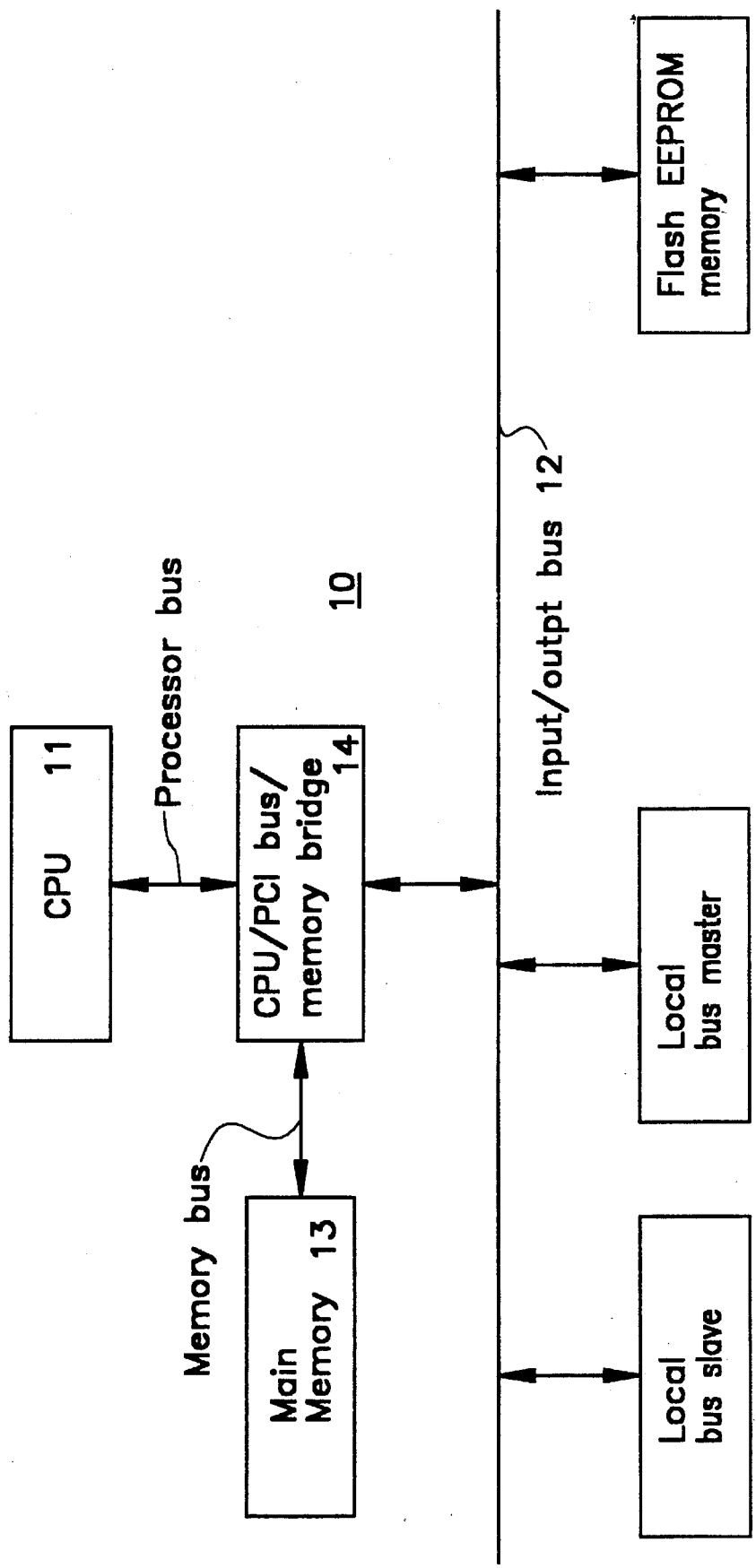
FIG. 1 is a block diagram of a computer system which may utilize the present invention.

Referring now to FIG. 1, there is illustrated a block diagram of a digital system 10 configured in accordance with one embodiment of the present invention. The present invention has application in any system, including a computer system, utilizing current mirroring circuitry in which a voltage level at a node which is very precisely controlled must be rapidly reached using currents which are insufficient to charge the node within a reasonable period. The system 10 illustrated includes a central processing unit 11 which executes the various instructions provided to control the operations of the system 10. The central processing unit 11 is typically joined by a processor bus to a bridge circuit 14 which controls access to an input/output bus 12 adapted to carry information between the various components of the system 10. The bridge 14 is also typically joined by a memory bus to main memory 13 which is typically constructed of dynamic random access memory arranged in a manner well known to those skilled in the prior art to store information during a period in which power is provided to the system 10. In FIG. 1, the bus 12 is preferably a peripheral component interface (PCI) bus or other local bus adapted to provide especially fast transfers of data. In a typical system 10, various input/output devices are connected as bus master and bus slave circuits to the bus 12.

In addition to the usual input/output devices typically joined to a system bus 12, additional memory may be provided for the system by a flash EEPROM memory array which may be positioned on the bus. A flash EEPROM memory array is one instance in which the present invention finds use in a computer system. A flash EEPROM memory array is constructed of a large plurality of floating-gate metal-oxide-silicon field effect transistor devices arranged as memory cells in typical row and column fashion with circuitry, for accessing individual cells and placing the memory transistors of those cells in different memory conditions. Such memory transistors may be programmed by storing a charge on the floating gate. This charge remains when power is removed from the array. The charge level may be detected by interrogating the devices.

In order to detect the value of the charges stored in one type of flash memory manufactured by Intel Corporation of Santa Clara, Calif., reference cells are provided which utilize additional flash EEPROM devices to furnish reference currents to each of the sensing outputs of each word. The current through the flash storage cells is compared with these reference currents through the flash reference cells to determine whether a "zero" or a "one" condition exists in the flash storage cells. Typically, the reference currents are relatively small so that it takes some time to bring the voltage at a comparison node to a steady state level. On the other hand, in order to make access time as short as possible, it is desirable to power up the reference cell as rapidly as possible.

Figure 2:
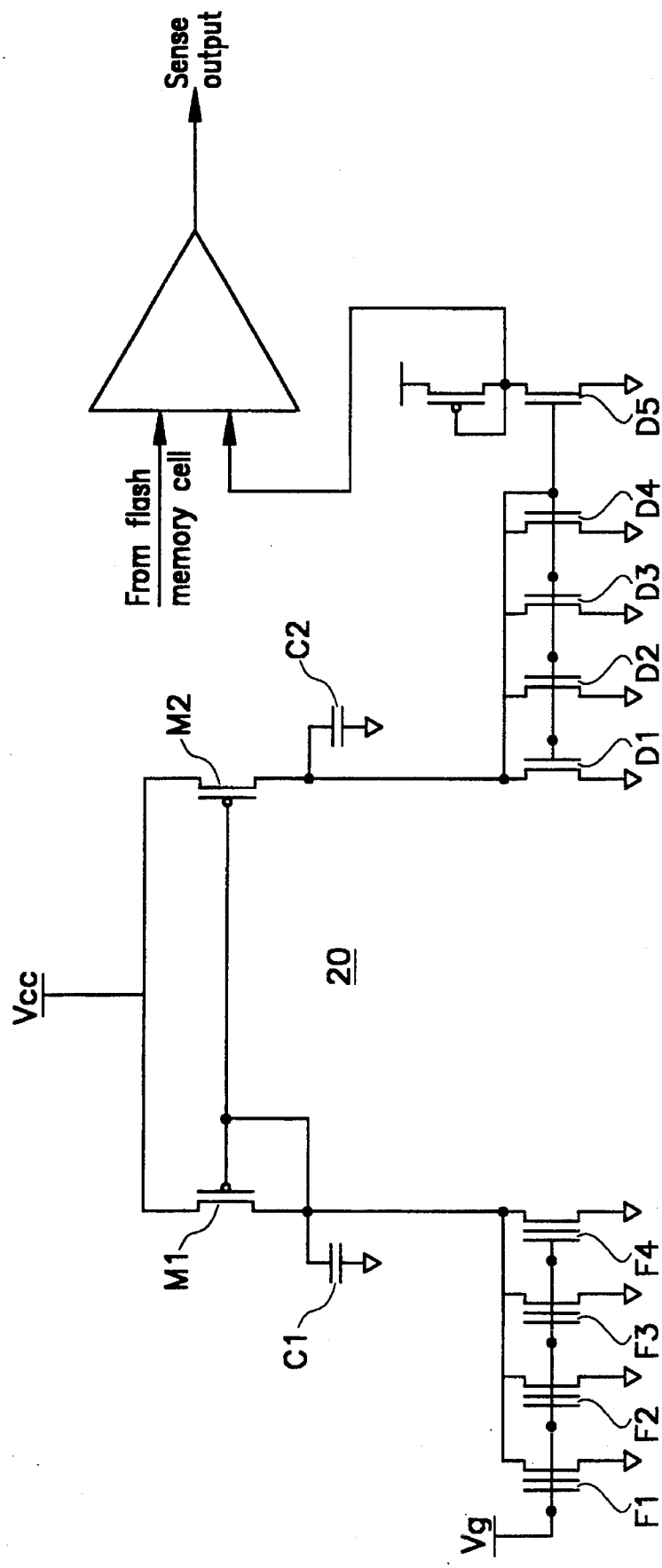
FIG. 2 is a block diagram of a circuit constructed in accordance with the present invention.

FIG. 2 is a circuit diagram illustrating the use of the present invention with a flash EEPROM memory array. The circuit 20 illustrated may be used to produce a current of a precise value through a N type transistor device D5 which may be used as a reference current for a sense amplifier to compare against current through a flash storage device. The current which is to be mirrored through the device D5 originates as a current equal to one-fourth of the total current through four identical flash EEPROM devices F1–F4. Although four flash devices are illustrated in this description, a larger or smaller number could as well be used depending on the parameters of the circuitry involved, the power on time desired, and the current necessary.

In the prior art, a single one of the devices F1–F4 would be used as a reference current for a sense amplifier. However, in one embodiment, the value of the current produced is between eight and ten microamperes, an amount insufficient to charge the inherent capacitance of the circuitry at the circuit node at which sense amplifier detection occurs within a realistic period. For this reason, the identical currents from a plurality of identical flash devices F1–F4 are summed and transferred by a P type field effect transistor device M1 between ground and a supply voltage Vcc. An inherent capacitance of the circuitry at the drain of the device M1 is represented by a capacitor C1. A P type device M2 identical to the device M1 is connected in a current mirroring arrangement with the device M1, and the two devices are biased to operate in saturation. The current through the device M2 flows between the supply voltage Vcc and ground through a plurality of identical N type field effect transistor device D1–D4 which are biased to function in saturation.

As will be seen, the current through the four flash devices F1–F4 is summed and transferred through the device M1. The current through the device M1 is mirrored through the device M2. This provides a great deal of current (four times, in the example) more than would be provided by an individual flash device for charging the capacitances at the nodes of the circuitry where the representative capacitors C1 and C2 are joined. Thus, the charging proceeds at four times the rate which would occur without the current multiplier circuitry.

On the other hand, the current through the device M2 is divided equally between the four identical devices D1–D4 to produce a current value through each individual device D1–D4 equal to the original current through an individual device F1–F4. This current is then mirrored through the N type device D5 (a device identical to the devices D1–D4 and operating in saturation at the same threshold voltage as these devices) to the sense amplifier for comparison with the current through the associated flash storage device. The present arrangement is especially useful in circuitry where the design of flash EEPROM devices is such that only one size device is available. By summing the small current values from a plurality of such devices, larger currents which allow more rapid charging may be realized. By matching the flash devices with an equal number of devices identical to one another in a dividing circuit, the exact value of the output current generated may be very precisely controlled to produce the value desired for comparison at the sense amplifier.

Thus, an original very small current is mirrored to the output in an operation which may be accomplished in one-fourth the power up time required (in the example) in typical circuitry yet is able to provide a very precise value of current at the output for operation.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A current mirroring circuit comprising:

a first field effect transistor device, a second field effect transistor device, the first and second transistor devices being connected to provide current mirroring, a first plurality of identical field effect transistor devices connected in parallel to provide current for the first field effect transistor device, the current through the first field effect transistor device being the sum of identical currents through each of the individual ones of the first plurality of identical field effect transistor devices, a second plurality of identical field effect transistor devices connected in parallel to divide current from the second field effect transistor device, the current through the second field effect transistor device being the sum of identical currents through each of the individual ones of the second plurality of identical field effect transistor devices, and an output field effect transistor device being connected to mirror the current through any one of the second plurality of field effect transistor devices.

2. A current mirroring circuit as claimed in claim 1 in which each of the first plurality of field effect transistor devices is a flash EEPROM device.

3. A current mirroring circuit as claimed in claim 1 in which the first plurality of field effect transistor devices total in number the second plurality of field effect transistor devices.

4. A current mirroring circuit as claimed in claim 1 in which current through the output field effect transistor device is used as reference current for a sense amplifier.

5. A computer system comprising:

a central processing unit;

main memory;

a system bus; and secondary memory joined to the system bus including:
- a current mirroring circuit comprising:
  - a first field effect transistor device,
  - a second field effect transistor device,
  - the first and second transistor devices being connected to provide current mirroring,
  - a first plurality of identical field effect transistor devices connected in parallel to provide current for the first field effect transistor device, the current through the first field effect transistor device being the sum of identical currents through each of the individual ones of the first plurality of identical field effect transistor devices,
  - a second plurality of identical field effect transistor devices connected in parallel to divide current from the second field effect transistor device, the current through the second field effect transistor device being the sum of identical currents through each of the individual ones of the second plurality of identical field effect transistor devices, and
  - an output field effect transistor device being connected to mirror the current through any one of the second plurality of field effect transistor devices.

6. A computer system as claimed in claim 5 in which each of the first plurality of field effect transistor devices is a flash EEPROM device.

7. A computer system as claimed in claim 5 in which the first plurality of field effect transistor devices total in number the second plurality of field effect transistor devices.

8. A computer system as claimed in claim 5 in which current through the output field effect transistor device is used as reference current for a sense amplifier.

9. A current mirroring circuit comprising:
- first field effect transistor means,
- second field effect transistor means,
- the first and second transistor means being connected to provide current mirroring,
- a first plurality of identical field effect transistor means connected in parallel to provide current for the first field effect transistor means, the current through the first field effect transistor means being the sum of identical currents through each of the individual ones of the first plurality of identical field effect transistor means,
- a second plurality of identical field effect transistor means connected in parallel to divide current from the second field effect transistor means, the current through the second field effect transistor means being the sum of identical currents through each of the individual ones of the second plurality of identical field effect transistor means, and
- an output field effect transistor means being connected to mirror the current through any one of the second plurality of field effect transistor means.

10. A current mirroring circuit as claimed in claim 9 in which each of the first plurality of field effect transistor means is a flash EEPROM device.

11. A current mirroring circuit as claimed in claim 9 in which the first plurality of field effect transistor means total in number the second plurality of field effect transistor means.

12. A current mirroring circuit as claimed in claim 9 in which current through the output field effect transistor means is used as reference current for sense amplifier means.

13. A flash EEPROM memory array comprising:
- a plurality of flash EEPROM memory devices,
- a plurality of sense amplifiers for detecting current in the flash EEPROM memory devices, and
- a plurality of current mirroring circuit each comprising:
  - a first field effect transistor device,
  - a second field effect transistor device,
  - the first and second transistor devices being connected to provide current mirroring,
  - a first plurality of identical field effect transistor devices connected in parallel to provide current for the first field effect transistor device, the current through the first field effect transistor device being the sum of identical currents through each of the individual ones of the first plurality of identical field effect transistor devices,
  - a second plurality of identical field effect transistor devices connected in parallel to divide current from the second field effect transistor device, the current through the second field effect transistor device being the sum of identical currents through each of the individual ones of the second plurality of identical field effect transistor devices, and
  - an output field effect transistor device being connected to mirror the current through any one of the second plurality of field effect transistor devices to provide a reference current for one of the plurality of sense amplifiers.

14. A flash EEPROM memory array as claimed in claim 13 in which each of the first plurality of field effect transistor devices is a flash EEPROM device.

15. A flash EEPROM memory array as claimed in claim 13 in which the first plurality of field effect transistor means total in number the second plurality of field effect transistor means.

16. A current mirroring circuit comprising:
- a first field effect transistor device,
- a second field effect transistor device,
- the first and second transistor devices being connected to provide current mirroring,
- a circuit for summing a first plurality of identical currents to provide current for the first field effect transistor device,
- a circuit for dividing the current from the second field effect transistor device into a second plurality of identical currents, and
- an output circuit connected to mirror any one of the second plurality of identical currents.

17. A current mirroring circuit as claimed in claim 16 in which the circuit for summing a first plurality of identical currents to provide current for the first field effect transistor device comprises a plurality of identical flash EEPROM field effect transistor devices connected in parallel.

18. A current mirroring circuit as claimed in claim 16 in which the circuit for dividing the current from the second field effect transistor device into a second plurality of identical currents comprises a plurality of identical field effect transistor devices connected in parallel.

19. A current mirroring circuit as claimed in claim 16 in which the circuit for summing a first plurality of identical currents to provide current for the first field effect transistor device comprises a plurality of identical flash EEPROM field effect transistor devices connected in parallel, in which the circuit for dividing the current from the second field effect transistor device into a second plurality of identical currents comprises a plurality of identical field effect transistor devices connected in parallel, and in which the plurality of identical flash EEPROM field effect transistor devices total in number the plurality of identical field effect transistor devices.

20. A method for mirroring a current through a field effect transistor device comprising the steps of:

summing currents from a plurality of field effect transistor devices identical to the device carrying current which is to be mirrored, mirroring the summed current, dividing the mirrored current into a plurality of currents equal in number to the plurality of field effect transistor devices, and mirroring the divided current.

* * * * *